(12) United States Patent
Wang et al.

(10) Patent No.: US 9,048,874 B2
(45) Date of Patent: Jun. 2, 2015

(54) MIN-SUM BASED HYBRID NON-BINARY LOW DENSITY PARITY CHECK DECODER

(71) Applicant: LSI Corporation, San Jose, CA (US)

(72) Inventors: Chung-Li Wang, San Jose, CA (US); Zongwang Li, San Jose, CA (US); Shu Li, Milpitas, CA (US); Fan Zhang, Milpitas, CA (US); Shaohua Yang, San Jose, CA (US)

(73) Assignee: LSI Corporation, San Jose, CA (US)

( * ) Notice: Subject to any disclaimer, the term of this patent is extended or adjusted under 35 U.S.C. 154(b) by 134 days.

(21) Appl. No.: 13/886,103

(22) Filed: May 2, 2013

(65) Prior Publication Data

US 2014/0281787 A1 Sep. 18, 2014

Related U.S. Application Data

(60) Provisional application No. 61/786,367, filed on Mar. 15, 2013.

(51) Int. Cl.
*H03M 13/00* (2006.01)
*H03M 13/13* (2006.01)
*H03M 13/11* (2006.01)

(52) U.S. Cl.
CPC .......... *H03M 13/13* (2013.01); *H03M 13/1122* (2013.01); *H03M 13/1125* (2013.01); *H03M 13/1171* (2013.01); *H03M 13/6583* (2013.01)

(58) Field of Classification Search
None
See application file for complete search history.

(56) References Cited

U.S. PATENT DOCUMENTS

| | | |
|---|---|---|
| 5,278,703 A | 1/1994 | Rub et al. |
| 5,278,846 A | 1/1994 | Okayama |
| 5,317,472 A | 5/1994 | Schweitzer, III |
| 5,325,402 A | 6/1994 | Ushirokawa |
| 5,392,299 A | 2/1995 | Rhines |
| 5,417,500 A | 5/1995 | Martinie |
| 5,513,192 A | 4/1996 | Janku |
| 5,523,903 A | 6/1996 | Hetzler |
| 5,550,810 A | 8/1996 | Monogioudis et al. |
| 5,550,870 A | 8/1996 | Blaker |
| 5,612,964 A | 3/1997 | Haraszti |
| 5,710,784 A | 1/1998 | Kindred |
| 5,717,706 A | 2/1998 | Ikeda |
| 5,802,118 A | 9/1998 | Bliss |
| 5,844,945 A | 12/1998 | Nam |

(Continued)

OTHER PUBLICATIONS

Sassatelli et al "Nonbinary Hybrid LDPC Codes" IEEE Transactionson Information Theory, IEEE Press, USA vol. 55, No. 10, Oct. 1, 2010.

(Continued)

*Primary Examiner* — Daniel McMahon
(74) *Attorney, Agent, or Firm* — Hamilton DeSanctis & Cha

(57) ABSTRACT

An apparatus for decoding data includes a variable node processor, a check node processor, and a field transformation circuit. The variable node processor is operable to generate variable node to check node messages and to calculate perceived values based on check node to variable node messages. The check node processor is operable to generate the check node to variable node messages and to calculate checksums based on variable node to check node messages. The variable node processor and the check node processor comprise different Galois fields. The field transformation circuit is operable to transform the variable node to check node messages from a first of the different Galois fields to a second of the Galois fields.

20 Claims, 6 Drawing Sheets

(56) References Cited

U.S. PATENT DOCUMENTS

| | | |
|---|---|---|
| 5,898,710 A | 4/1999 | Amrany |
| 5,923,713 A | 7/1999 | Hatakeyama |
| 5,978,414 A | 11/1999 | Nara |
| 5,983,383 A | 11/1999 | Wolf |
| 6,005,897 A | 12/1999 | Mccalissister |
| 6,023,783 A | 2/2000 | Divsalar |
| 6,029,264 A | 2/2000 | Kobayashi |
| 6,065,149 A | 5/2000 | Yamanaka |
| 6,097,764 A | 8/2000 | McCallister |
| 6,145,110 A | 11/2000 | Khayrallah |
| 6,216,249 B1 | 4/2001 | Bliss |
| 6,216,251 B1 | 4/2001 | McGinn |
| 6,266,795 B1 | 7/2001 | Wei |
| 6,317,472 B1 | 11/2001 | Choi |
| 6,351,832 B1 | 2/2002 | Wei |
| 6,377,610 B1 | 4/2002 | Hagenauer |
| 6,381,726 B1 | 4/2002 | Weng |
| 6,473,878 B1 | 10/2002 | Wei |
| 6,535,553 B1 | 3/2003 | Limberg et al. |
| 6,625,775 B1 | 9/2003 | Kim |
| 6,748,034 B2 | 6/2004 | Hattori |
| 6,757,862 B1 | 6/2004 | Marianetti, II |
| 6,785,863 B2 | 8/2004 | Blankenship et al. |
| 6,810,502 B2 | 10/2004 | Eidson |
| 6,970,511 B1 | 11/2005 | Barnette |
| 6,986,098 B2 | 1/2006 | Poeppelman |
| 7,047,474 B2 | 5/2006 | Rhee |
| 7,058,873 B2 | 6/2006 | Song |
| 7,073,118 B2 | 7/2006 | Greenberg |
| 7,093,179 B2 | 8/2006 | Shea |
| 7,117,427 B2 | 10/2006 | Ophir |
| 7,133,228 B2 | 11/2006 | Fung |
| 7,184,486 B1 | 2/2007 | Wu |
| 7,191,378 B2 | 3/2007 | Eroz |
| 7,203,887 B2 | 4/2007 | Eroz |
| 7,308,061 B1 | 12/2007 | Huang |
| 7,310,768 B2 | 12/2007 | Eidson |
| 7,313,750 B1 | 12/2007 | Feng |
| 7,370,258 B2 | 5/2008 | Iancu |
| 7,415,651 B2 | 8/2008 | Argon |
| 7,502,189 B2 | 3/2009 | Sawaguchi |
| 7,523,375 B2 | 4/2009 | Spencer |
| 7,587,657 B2 | 9/2009 | Haratsch |
| 7,590,168 B2 | 9/2009 | Raghavan |
| 7,646,829 B2 | 1/2010 | Ashley |
| 7,702,986 B2 | 4/2010 | Bjerke |
| 7,752,523 B1 | 7/2010 | Chaichanavong |
| 7,779,325 B2 | 8/2010 | Song |
| 7,802,172 B2 | 9/2010 | Casado |
| 7,952,824 B2 | 5/2011 | Dziak |
| 7,958,425 B2 | 6/2011 | Chugg |
| 7,996,746 B2 | 8/2011 | Livshitz |
| 8,018,360 B2 | 9/2011 | Nayak |
| 8,201,051 B2 | 6/2012 | Tan |
| 8,237,597 B2 | 8/2012 | Liu |
| 8,261,171 B2 | 9/2012 | Annampedu |
| 8,291,284 B2 | 10/2012 | Savin |
| 8,295,001 B2 | 10/2012 | Liu |
| 2007/0226585 A1* | 9/2007 | Park et al. ............... 714/758 |
| 2008/0069373 A1 | 3/2008 | Jiang |
| 2008/0304558 A1 | 12/2008 | Zhu et al. |
| 2009/0132893 A1 | 5/2009 | Miyazaki |
| 2009/0185643 A1 | 7/2009 | Fitzpatrick |
| 2011/0167227 A1 | 7/2011 | Yang |
| 2011/0264987 A1 | 10/2011 | Li |
| 2012/0124118 A1 | 5/2012 | Ivkovic |
| 2012/0182643 A1 | 7/2012 | Zhang |
| 2012/0207201 A1 | 8/2012 | Xia |
| 2012/0212849 A1 | 8/2012 | Xu |
| 2012/0262814 A1 | 10/2012 | Li |
| 2012/0265488 A1 | 10/2012 | Sun |
| 2013/0019141 A1* | 1/2013 | Wang et al. ............... 714/763 |

OTHER PUBLICATIONS

Axvig et al., "Average Min-Sum Decoding of LDPC Codes", 5th International Symposium on Turbo Codes and Related Topics (2008).

Lin et al "An efficient VLSI Architecture for non binary LDPC decoders"—IEEE Transaction on Circuits and Systems II vol. 57, Issue 1 (Jan. 2010) pp. 51-55.

U.S. Appl. No. 13/174,537, Unpublished (filed Jun. 30, 2011) (Anantha Raman Krishnan).

U.S. Appl. No. 13/284,730, Unpublished (filed Oct. 28, 2011) (Fan Zhang).

U.S. Appl. No. 13/284,767, Unpublished (filed Oct. 28, 2011) (Fan Zhang).

U.S. Appl. No. 13/742,340, Unpublished (filed Jan. 15, 2013) (Razmik Karabed).

U.S. Appl. No. 13/227,544, Unpublished (filed Sep. 8, 2011) (Shaohua Yang).

U.S. Appl. No. 13/186,234, Unpublished (filed Jul. 19, 2011) (Haitao Xia).

U.S. Appl. No. 13/213,751, Unpublished (filed Aug. 19, 2011) (Fan Zhang).

U.S. Appl. No. 13/283,549, Unpublished (filed Oct. 27, 2011) (Wu Chang).

U.S. Appl. No. 13/296,022, Unpublished (filed Nov. 14, 2011) (Victor Krachkovsky).

U.S. Appl. No. 13/180,495, Unpublished (filed Jul. 11, 2011) (Chung-Li Wang).

U.S. Appl. No. 13/174,453, Unpublished (filed Jun. 30, 2011) (Johnson Yen).

U.S. Appl. No. 13/171,615, Unpublished (filed Jun. 29, 2011) (Bradley D. Seago).

U.S. Appl. No. 13/113,219, Unpublished (filed May 23, 2011) (Yang Han).

U.S. Appl. No. 13/269,832, Unpublished (filed Oct. 10, 2011) (Haitao Xia).

U.S. Appl. No. 13/269,852, Unpublished (filed Oct. 10, 2011) (Haitao Xia).

U.S. Appl. No. 13/227,416, Unpublished (filed Sep. 7, 2011) (Lei Chen).

U.S. Appl. No. 13/989,583, Unpublished (filed Oct. 15, 2012) (Shaohua Yang).

U.S. Appl. No. 13/445,834, Unpublished (filed Apr. 12, 2012) (Chung-Li Wang).

U.S. Appl. No. 13/545,833, Unpublished (filed Jul. 10, 2012) (Zhi Bin Li).

U.S. Appl. No. 13/305,551, Unpublished (filed Nov. 28, 2011) (Yang Han).

U.S. Appl. No. 13/596,947, Unpublished (filed Aug. 28, 2012) (Fan Zhang).

U.S. Appl. No. 13/239,683, Unpublished (filed Sep. 22, 2011) (Changyou Xu).

U.S. Appl. No. 13/596,978, Unpublished (filed Aug. 28, 2012) (Fan Zhang).

U.S. Appl. No. 13/597,001, Unpublished (filed Aug. 28, 2012) (Fan Zhang).

U.S. Appl. No. 13/619,907, Unpublished (filed Sep. 14, 2012) (Fan Zhang).

U.S. Appl. No. 13/363,751, Unpublished (filed Feb. 1, 2012) (Lei Chen).

U.S. Appl. No. 13/597,026, Unpublished (filed Aug. 28, 2012) (Fan Zhang).

U.S. Appl. No. 13/596,819, Unpublished (filed Aug. 28, 2012) (Shaohua Yang).

U.S. Appl. No. 13/622,294, Unpublished (filed Sep. 18, 2012) (Fan Zhang).

U.S. Appl. No. 13/670,393, Unpublished (filed Nov. 6, 2012) (Lei Chen).

U.S. Appl. No. 13/777,841, Unpublished (filed Feb. 26, 2013) (Shu Li).

(56) References Cited

OTHER PUBLICATIONS

U.S. Appl. No. 13/777,976, Unpublished (filed Feb. 26, 2013) (Shu Li).
U.S. Appl. No. 13/777,381, Unpublished (filed Feb. 26, 2013) (Shaohua Yang).
U.S. Appl. No. 13/741,003, Unpublished (filed Jan. 14, 2013) (Lu Lu).
U.S. Appl. No. 13/873,224, Unpublished (filed Apr. 30, 2013) (Razmik Karabed).
U.S. Appl. No. 13/742,336, Unpublished (filed Jan. 15, 2013) (Jianzhong Huang).
U.S. Appl. No. 13/621,341, Unpublished (filed Sep. 17, 2012) (Shaohua Yang).
U.S. Appl. No. 13/426,714, Unpublished (filed Mar. 22, 2012) (Shaohua Yang).
U.S. Appl. No. 13/302,119, Unpublished (filed Nov. 22, 2011) (Lei Chen).
U.S. Appl. No. 13/300,078, Unpublished (filed Nov. 18, 2011) (Chung-Li Wang).
U.S. Appl. No. 13/295,150, Unpublished (filed Nov. 14, 2011) (Zongwang Li).
U.S. Appl. No. 13/305,510, Unpublished (filed Nov. 28, 2011) (Lei Chen).
U.S. Appl. No. 13/369,468, Unpublished (filed Feb. 9, 2012) (Zongwang Li).
U.S. Appl. No. 13/340,951, Unpublished (filed Dec. 30, 2011) (Lei Chen).
U.S. Appl. No. 13/340,974, Unpublished (filed Dec. 30, 2011) (Dan Liu).
U.S. Appl. No. 13/327,279, Unpublished (filed Dec. 15, 2011) (Wei Feng).
U.S. Appl. No. 13/316,741, Unpublished (filed Dec. 12, 2011) (Yang Han).
U.S. Appl. No. 13/316,858, Unpublished (filed Dec. 12, 2011) (Zongwang Li).
U.S. Appl. No. 13/362,409, Unpublished (filed Jan. 31, 2012) (Fan Zhang).
U.S. Appl. No. 13/445,848, Unpublished (filed Apr. 12, 2012) (Bruce Wilson).
U.S. Appl. No. 13/412,520, Unpublished (filed Mar. 5, 2012) (Fan Zhang).
U.S. Appl. No. 13/372,580, Unpublished (filed Feb. 14, 2012) (Fan Zhang).
U.S. Appl. No. 13/422,986, Unpublished (filed Mar. 16, 2012) (Fan Zhang).
U.S. Appl. No. 13/433,693, Unpublished (filed Mar. 29, 2012) (Fan Zhang).
U.S. Appl. No. 13/445,878, Unpublished (filed Apr. 12, 2012) (Yu Liao).
U.S. Appl. No. 13/474,660, Unpublished (filed May 17, 2012) (Zongwang Li)

* cited by examiner $$\begin{bmatrix} 1 & 0 & 0 & 1 & 0 & 0 & 3 \\ 0 & 2 & 0 & 1 & 0 & 1 & 0 \\ 0 & 1 & 1 & 0 & 2 & 0 & 1 \end{bmatrix} C=0$$

FIG. 1A $$C = \begin{bmatrix} 0 & 3 & 1 & 1 & 0 & 0 & 2 \end{bmatrix}^T$$

FIG. 1B $$\begin{bmatrix} 1 & 0 & 0 & 0 & 0 & 0 & 1 & 0 & 0 & 0 & 0 & 0 & 1 \\ 0 & 1 & 0 & 0 & 0 & 0 & 0 & 1 & 0 & 0 & 0 & 1 & 1 \\ 0 & 0 & 1 & 1 & 0 & 0 & 1 & 0 & 0 & 0 & 1 & 0 & 0 \\ 0 & 0 & 1 & 0 & 0 & 0 & 0 & 1 & 0 & 0 & 0 & 1 & 0 \\ 0 & 0 & 1 & 0 & 1 & 0 & 0 & 0 & 1 & 1 & 0 & 0 & 1 & 0 \\ 0 & 0 & 0 & 1 & 0 & 1 & 0 & 0 & 1 & 0 & 0 & 0 & 1 \end{bmatrix} C^B = 0$$

FIG. 1C $$C^B = \begin{bmatrix} 00 & 11 & 01 & 01 & 00 & 00 & 10 \end{bmatrix}^T$$

FIG. 1D $$\begin{bmatrix} 1 & 0 & 0 & 4 & 0 & 0 & 3 \\ 0 & 2 & 0 & 1 & 0 & 5 & 0 \\ 0 & 6 & 1 & 0 & 2 & 0 & 1 \end{bmatrix} C=0$$

FIG. 1E $$C = \begin{bmatrix} 0 & 3 & 1 & 1 & 0 & 0 & 2 \end{bmatrix}^T$$

FIG. 1F

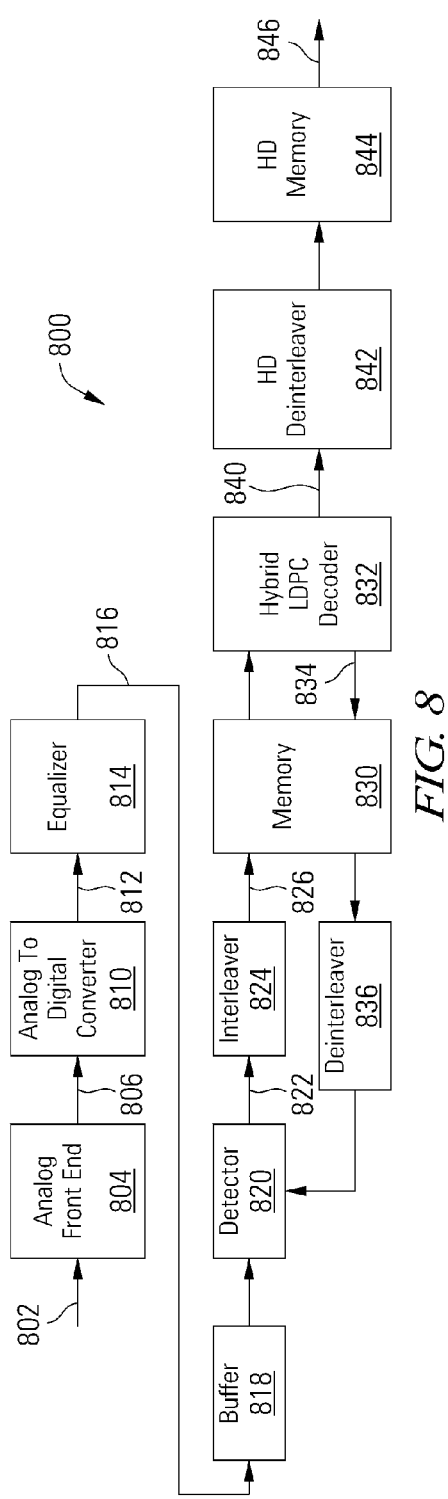
FIG. 8
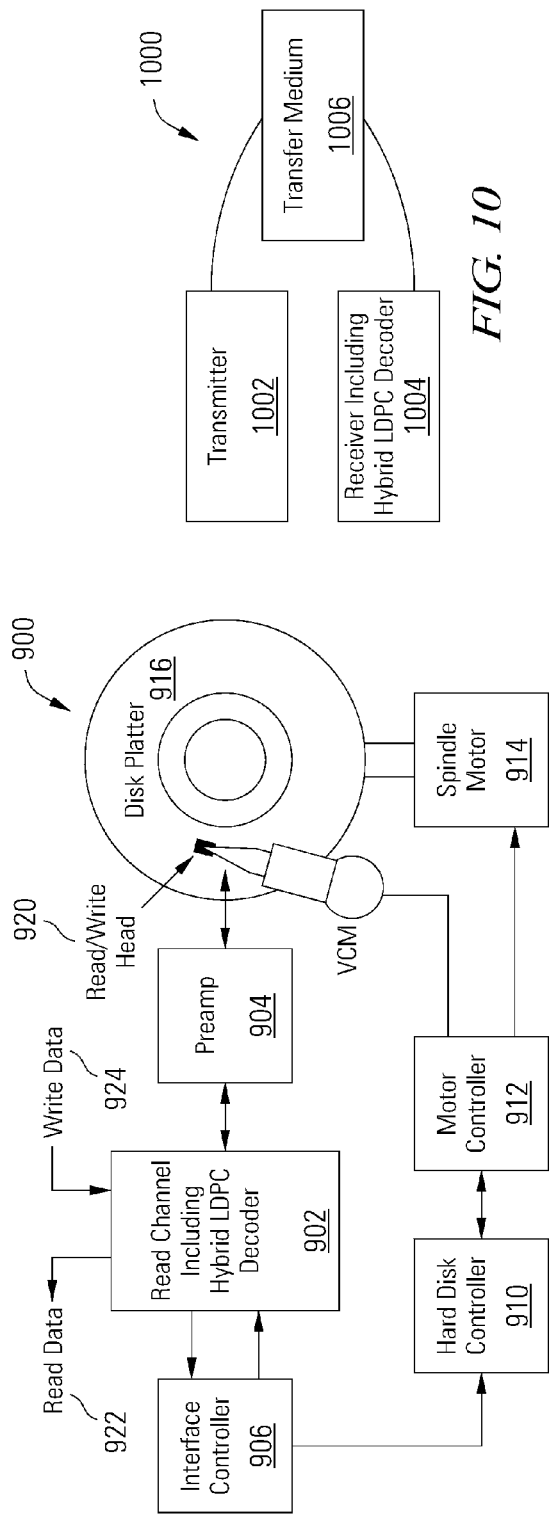
FIG. 10
FIG. 9

US 9,048,874 B2

MIN-SUM BASED HYBRID NON-BINARY LOW DENSITY PARITY CHECK DECODER

CROSS REFERENCE TO RELATED APPLICATIONS

The present application claims priority to (is a non-provisional of) U.S. Pat. App. No. 61/786,367, entitled "Min-Sum Based Hybrid Non-Binary Low Density Parity Check Decoder", and filed Mar. 15, 2013 by Wang et al, the entirety of which is incorporated herein by reference for all purposes.

FIELD OF THE INVENTION

Various embodiments of the present invention provide systems and methods for data processing, and more particularly systems and methods for a min-sum based hybrid non-binary low density parity check decoder.

BACKGROUND

Various data processing systems have been developed including storage systems, cellular telephone systems, and radio transmission systems. In such systems data is transferred from a sender to a receiver via some medium. For example, in a storage system, data is sent from a sender (i.e., a write function) to a receiver (i.e., a read function) via a storage medium. As information is stored and transmitted in the form of digital data, errors are introduced that, if not corrected, can corrupt the data and render the information unusable. The effectiveness of any transfer is impacted by any losses in data caused by various factors. Many types of error checking systems have been developed to detect and correct errors in digital data. One such error checking system is a low density parity check (LDPC) decoder, which detects and corrects errors in a codeword based on parity bits in the codeword.

SUMMARY

Various embodiments of the present invention provide systems and methods for data processing, and more particularly to systems and methods for encoding data in a data processing system.

A data processing system is disclosed including an apparatus for decoding data having a variable node processor and a check node processor. The variable node processor is operable to generate variable node to check node messages and to calculate perceived values based on check node to variable node messages. The check node processor is operable to generate the check node to variable node messages and to calculate checksums based on variable node to check node messages. The variable node processor and the check node processor have different Galois fields.

This summary provides only a general outline of some embodiments of the invention. The phrases "in one embodiment," "according to one embodiment," "in various embodiments", "in one or more embodiments", "in particular embodiments" and the like generally mean the particular feature, structure, or characteristic following the phrase is included in at least one embodiment of the present invention, and may be included in more than one embodiment of the present invention. Importantly, such phrases do not necessarily refer to the same embodiment. This summary provides only a general outline of some embodiments of the invention.

Additional embodiments are disclosed in the following detailed description, the appended claims and the accompanying drawings.

BRIEF DESCRIPTION OF THE FIGURES

A further understanding of the various embodiments of the present invention may be realized by reference to the figures which are described in remaining portions of the specification. In the figures, like reference numerals may be used throughout several drawings to refer to similar components. In the figures, like reference numerals are used throughout several figures to refer to similar components.

FIG. 1A depicts a parity check matrix for a hybrid non-binary low density parity check decoder in accordance with one or more embodiments of the present invention;

FIG. 1B depicts a vector for a codeword used in connection with the parity check matrix of FIG. 1A to compute a syndrome in a hybrid non-binary low density parity check decoder in accordance with one or more embodiments of the present invention;

FIG. 1C depicts a binary image equivalent of the parity check matrix of FIG. 1A for a hybrid non-binary low density parity check decoder in accordance with one or more embodiments of the present invention;

FIG. 1D depicts a binary vector for a codeword used in connection with the binary image parity check matrix of FIG. 1C to compute a syndrome in a hybrid non-binary low density parity check decoder in accordance with one or more embodiments of the present invention;

FIG. 1E depicts a linear group equivalent of the parity check matrix of FIG. 1A for a hybrid non-binary low density parity check decoder in accordance with one or more embodiments of the present invention;

FIG. 1F depicts a binary vector for a codeword used in connection with the linear group form parity check matrix of FIG. 1E to compute a syndrome in a hybrid non-binary low density parity check decoder in accordance with one or more embodiments of the present invention;

FIG. 8 depicts a block diagram of a read channel with a hybrid min-sum based non-binary low density parity check decoder which may be used to retrieve or receive stored or transmitted data in accordance with one or more embodiments of the present invention;

FIG. 9 depicts a storage system including a data processing system with a hybrid min-sum based non-binary low density parity check decoder in accordance with one or more embodiments of the present invention; and FIG. 10 depicts a wireless communication system including a data processing system with a hybrid min-sum based non-binary low density parity check decoder in accordance with one or more embodiments of the present invention.

DETAILED DESCRIPTION OF THE INVENTION

Figure 2:
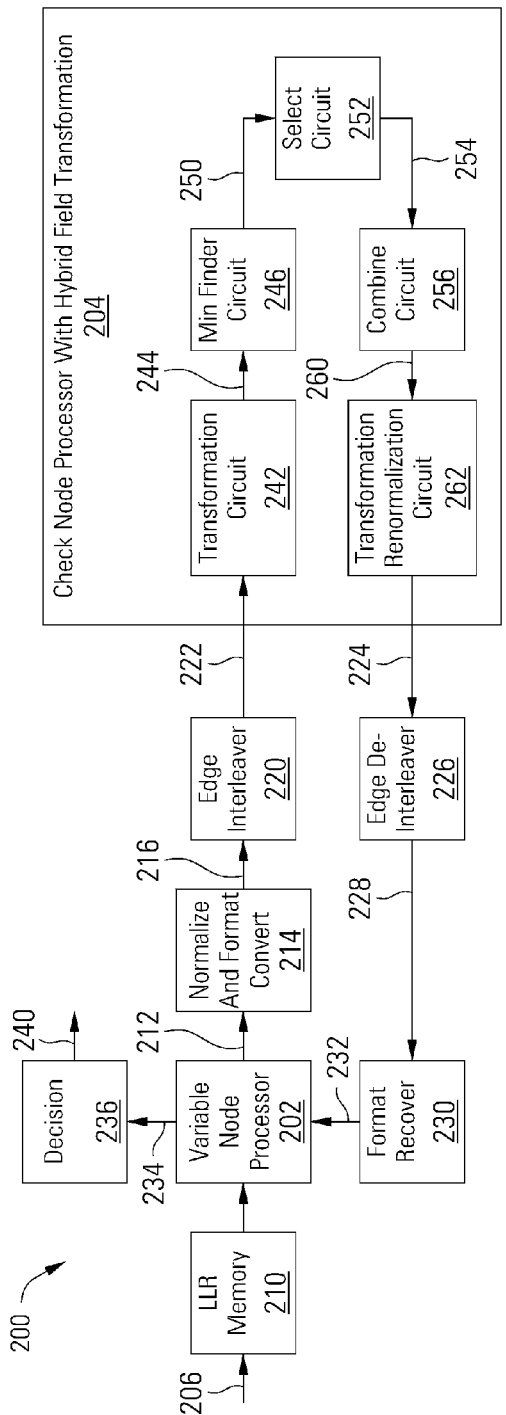
FIG. 2 is a block diagram of a hybrid min-sum based non-binary low density parity check decoder in accordance with one or more embodiments of the present invention.

Various embodiments of the present invention are related to systems and methods for decoding data, and more particularly to systems and methods for min-sum based decoding of hybrid non-binary low density parity check (LDPC) codes. A hybrid low density parity check decoder is one in which check nodes and variable nodes have different Galois field sizes. In a non-binary low density parity check decoder, variable nodes contain symbols from a Galois field, a finite field $GF(p^k)$ that contains a finite number of elements, characterized by size $p^k$ where p is a prime number and k is a positive integer. In a hybrid low density parity check decoder, the size or number of elements in the Galois field is different for variable nodes and check nodes, in other words using two different Galois fields for check nodes and variable nodes. The parity check matrix is defined in a linear group. A min-sum based non-binary low density parity check decoder can be generalized for use with hybrid codes by generalizing from the non-hybrid Galois field decoder to a linear group. The decoder handles the mapping between different Galois fields between variable nodes and check nodes, converting the messages. If the hard decision from the check node processor cannot be mapped to the variable node processor format, the message is renormalized to obtain the hard decision.

Check nodes (or check node processors) in a min-sum based hybrid non-binary low density parity check decoder receive incoming messages from connected or neighboring variable nodes and generate outgoing messages to each neighboring variable node to implement the parity check matrix for the low density parity check code. Incoming messages to check nodes are also referred to herein as V2C messages, indicating that they flow from variable nodes to check nodes, and outgoing messages from check nodes are also referred to herein as C2V messages, indicating that they flow from check nodes to variable nodes. The check node uses multiple V2C messages to generate an individualized C2V message for each neighboring variable node. Messages in the min-sum based hybrid non-binary low density parity check decoder are scalar values transmitted as plain-likelihood probability values or log-likelihood-ratio (LLR) values representing the probability that the sending variable node contains a particular value.

Each element of the Galois field has a unique binary vector form. By converting the codeword by replacing symbols by their corresponding binary vector, the binary image of the codeword is obtained. The binary image is checked in the decoder by the binary image of the parity check matrix. Each element has two alternative forms, a binary vector form and a unique binary matrix form. Replacing the entry of the parity check matrix by the corresponding binary matrix, the binary image of the parity check matrix is obtained. In one embodiment with GF(4), having elements {0, 1, 2, 3}, the elements in data symbols are replaced by their corresponding binary vectors with unique binary matrix forms as follows:

0→vector: [0 0]; matrix: [0 0; 0 0]
1→vector: [0 1]; matrix: [1 0; 0 1]
2→vector: [1 0]; matrix: [1 1; 1 0]
3→vector: [1 1]; matrix: [0 1; 1 1]

Each entry in GF(4) is a bijective mapping GF(4)→GF(4) for all a, b in GF(4), defined as b=h*a in binary matrix form, where h is an element of the Galois field GF(4).

The hybrid non-binary low density parity check decoder detects data convergence by calculating a syndrome S by taking the dot product of the codeword C with the parity check matrix H, or S=C·H. The syndrome S is a vector with value 0 when the data has converged to the correct values. An example is shown in FIG. 1A, in which a parity check matrix 100 is shown in symbol form in GF(4). The dot product of parity check matrix 100 and codeword C 102 yields the syndrome 104, which is 0 when data has converged to correct values. The example vector for codeword C 102 in one embodiment is shown in FIG. 1B. The codeword C 102 is a vector from top end down so that it can be multiplied by the parity check matrix 100. An equivalent form is shown in FIG. 1C, where parity check matrix 110 is the binary image of parity check matrix 100. The dot product of binary image parity check matrix 110 and binary vector codeword C 112 yields the syndrome 114, which is 0 when data has converged to correct values. The example binary vector for codeword C 112 in one embodiment is shown in FIG. 1D.

If the matrix form of a non-binary symbol is used, a non-binary parity check matrix can be transformed into a binary matrix by replacing each symbol with a unique binary matrix according to a finite field. This action, referred to as superposition, can be generalized from GF(q) to a linear group.

The difference between the Galois field and a linear group is that the inverse cannot always be found using a linear group, such as but not limited to an addition inverse or multiplication inverse. However, the parity check matrix can still be defined as a linear group even if there is no inverse function. If a linear group LG(2,2) is defined as {0, 1, 2, 3, 4, 5, 6}, and each element corresponds to a unique binary matrix, the parity check matrix can be defined based on the linear group LG(2,2) to produce the binary image of the parity check matrix given the binary matrix definitions below:

0→matrix: [0 0; 0 0]
1→matrix: [1 0; 0 1]
2→matrix: [1 1; 1 0]
3→matrix: [0 1; 1 1]
4→matrix: [1 1; 0 1]
5→matrix: [0 1; 1 0]
6→matrix: [1 0; 1 1]

This process includes selecting seven binary matrices, and each of them are named by a different number from 0 to 6. For a linear group, the name of each element or binary matrix is defined during the design process. The codeword is still a sequence of symbols in GF(4). However, the parity check matrix is in linear group form LG(2,2). Each entry in LG(2,2) is a bijective mapping GF(4)→GF(4) for all a, b in GF(4), defined as b=h*a in binary matrix form, where h is an element of the linear group LG(2,2).

The example syndrome calculation of FIGS. 1A-1D is repeated in FIGS. 1E-1H, in which the codeword C is in GF(4) form and the parity check matrix H is in linear group LG(2,2) form. Parity check matrix 120 is shown in FIG. 1E in linear group LG(2,2) form, with top-down vector codeword C 122 in GF(4) form. The example vector for codeword C 122 in one embodiment is shown in FIG. 1F.

Linear groups can be defined using square matrices as disclosed above. In other embodiments, linear groups are defined based on rectangular matrices. In some alternative embodiments, the linear group is defined based a 3×1 matrix, yielding linear group LG(3,1). In an embodiment with eight elements LG(3,1)={0, 1, 2, 3, 4, 5, 6, 7}, this makes available eight matrices which are each named with a number as follows:

0→matrix: [0 0 0]'
1→matrix: [1 0 0]'
2→matrix: [0 1 0]'
3→matrix: [1 1 0]'
4→matrix: [0 0 1]'
5→matrix: [1 0 1]'
6→matrix: [0 1 1]'
7→matrix: [1 1 1]'

Thus, the linear group by which a parity check matrix can be transformed is defined in a manner such as, but not limited to, the example embodiments above. First the Galois field is generalized to a linear group with a square matrix, and the linear group with a square matrix is generalized to a linear group with a rectangular matrix. The codeword C is still a sequence of symbols in GF(2), a binary Galois field. However, the parity check matrix is now a linear group of rectangular matrices in LG(3,1) form. Each entry in LG(3,1) is an injective mapping GF(2)→GF(8) for a in GF(2), b in GF(8), defined as b=h*a in binary matrix form, where h is an element of the linear group LG(3,1), and where a is the inverse of b. For example, H=3; 0→[0 0 0]'; 1→[0 0 1]'; whereas [0 0 1] has no inverse. If a binary number 0 or 1 is multiplied by an element in a linear group LG(3,1), the result is a 3×1 matrix times a binary number. If the result is b, where b=H*a, H is an element of the linear group LG(3,1) and a is the binary number. The result b is a 3×1 binary matrix. It can be said that a is the inverse of b. Only $2^q$ symbols in GF($2^p$) have an inverse. In other words, when operating in GF(8) in this embodiment, there is always an inverse, however, when operating in the linear group LG(3,1), there will not always be an inverse. When the inverse is not available, the hybrid non-binary low density parity check decoder will renormalize the message to obtain the hard decision.

To generalize a non-hybrid decoder from Galois field form to a hybrid decoder with linear group form, the check node unit in the hybrid decoder is adapted to map V2C messages from GF($2^q$) to GF($2^p$). The check node unit operates in the GF($2^p$) domain, and the check node unit result (or C2V message) is inverse-mapped from GF($2^p$) to GF($2^q$). For linear group LG(p,q), with p>q, the variable node unit which performs variable node updates and generates V2C messages has dimension $2^q$, and the check node unit which generates C2V messages has dimension $2^p$. The V2C and C2V messages have size $2^q-1$ in Galois field GF($2^q$), and the $min_1$ and $min_2$ messages in a simplified min-sum based decoder have size $2^p-1$ in Galois field GF($2^p$). Using the linear group, a symbol is mapped from the variable node unit to a symbol for the check node unit, although for some symbols in the check node unit, the corresponding symbol cannot be found for the variable node unit without renormalization.

Both V2C and C2V messages are vectors, each including a number of sub-messages with log likelihood ratio values, and each with size $2^q-1$ in Galois field GF($2^q$), although $min_1$ and $min_2$ messages in the check node processor or check node unit are transformed to size $2^p-1$ in Galois field GF($2^p$) in the hybrid decoder. Each V2C message vector from a particular variable node will contain sub-messages corresponding to each symbol in the Galois field, with each sub-message giving the likelihood that the variable node contains that particular symbol. For example, given a Galois field GF($2^q$) with $2^q$ elements, V2C and C2V messages will include at least $2^q$ sub-messages representing the likelihood for each symbol in the field. Message normalization in the simplified min-sum decoding is performed with respect to the most likely symbol.

Thus, the V2C and C2V vector format includes two parts, an identification of the most likely symbol and the log likelihood ratio for the other $2^q-1$ symbols, since the most likely symbol has log likelihood ratio equal to 0 after normalization.

Generally, the C2V vector message from a check node to a variable node contains the probabilities for each symbol d in the Galois field that the destination variable node contains that symbol d, based on the prior round V2C messages from neighboring variable nodes other than the destination variable node. The inputs from neighboring variable nodes used in a check node to generate the C2V message for a particular neighboring variable node are referred to as extrinsic inputs and include the prior round V2C messages from all neighboring variable nodes except the particular neighboring variable node for which the C2V message is being prepared, in order to avoid positive feedback. The check node thus prepares a different C2V message for each neighboring variable node, using the different set of extrinsic inputs for each message based on the destination variable node.

In the min-sum based decoding disclosed herein, also referred to as simplified min-sum decoding, the check nodes calculate the minimum sub-message $min_1(d)$, the index idx(d) of $min_1(d)$, and the sub-minimum sub-message $min_2(d)$, or minimum of all sub-messages excluding $min_1(d)$, for each nonzero symbol d in the Galois field based on all extrinsic V2C messages from neighboring variable nodes. In other words, the sub-messages for a particular symbol d are gathered from messages from all extrinsic inputs, and the $min_1(d)$, idx(d) and $min_2(d)$ is calculated based on the gathered sub-messages for that symbol d. The value $min_1$) is the minimum of the sub-messages, idx(d) is the sub-message index of $min_1$(d), and $min_2(d)$ is the next minimum or sub-minimum sub-message, the minimum of all sub-messages excluding $min_1$(d). For a Galois field with $2^{p-1}$ symbols, the check node will calculate the $min_1(d)$, idx(d) and $min_2(d)$ sub-message for each of the p−1 non-zero symbols in the field except the most likely symbol. The $min_1(d)$, idx(d) and $min_2(d)$ values are stored in a memory for use in calculating the C2V message, requiring much less memory than the traditional non-binary check node processor that stores each intermediate forward and backward message.

Turning to FIG. 2, a block diagram of a hybrid min-sum based non-binary low density parity check decoder 200 is illustrated. The block diagram of FIG. 2 illustrates the processing flow between variable node processor 202 and check node processor 204. Multiple variable nodes and check nodes may be implemented in a single variable node processor 202 and check node processor 204 as in FIG. 2. In other embodiments, multiple variable node processors and check node processors may be included, for example having the number of variable node processors and check node processors corresponding directly to the number of variable nodes and check nodes in the Tanner Graph. The min-sum based non-binary low density parity check decoder 200 is not limited to any particular topology and may be adapted to meet the requirements of any number of specific applications. Based on the disclosure provided herein, one of ordinary skill in the art will recognize a variety of low density parity check circuits that may be adapted to hybrid min-sum based non-binary low density parity check decoding, both currently known and that may be developed in the future.

The hybrid min-sum based non-binary low density parity check decoder 200 is provided with log likelihood ratio values from an input channel 206, which may be stored in an log likelihood ratio memory 210. As discussed above, in other embodiments, plain likelihood probability values are used rather than log likelihood ratio values. The values are provided to the variable node processor 202, which updates the perceived value of the symbol corresponding with the variable node processor 202 based on the value from input channel 206 and on C2V message vectors from neighboring check node processors (e.g., 204). The variable node processor 202 also generates V2C message vectors 212 for neighboring check nodes in check node processors (e.g., 204). The V2C message vectors 212 are provided to a message format converter 214 which converts the format of V2C message vectors 212 to a format consisting of two parts, the most likely symbol or hard decision, and the log likelihood ratio of other symbols, normalized to the most likely symbol, yielding normalized V2C message vectors 216 in the second format. The normalized V2C message vectors 216 are provided to an edge interleaver 220 which shuffles messages on the boundaries at message edges, randomizing noise and breaking dependencies between messages. The interleaved normalized V2C message vectors 222 are provided to the check node processor 204, which generates C2V messages 224 for each neighboring variable node processor based on extrinsic V2C messages from other neighboring variable nodes. The check node processor 204 generates C2V messages 224 using a min-sum based algorithm based on extrinsic V2C messages from the variable node processor 202. The check node processor 204 also maps or transforms the V2C and C2V messages 222, 224, such that V2C and C2V messages 222, 224 have size $2^q-1$ in Galois field $GF(2^q)$, although the check node processor 204 performs min-sum based processing in a $GF(2^p)$ domain, where $min_1$ and $min_1$ messages in the check node processor 204 have size $2^p-1$ in Galois field $GF(2^p)$.

The check node processor 204 includes a transformation circuit 242 which transforms V2C messages 222 from Galois field $GF(2^q)$, yielding transformed V2C messages 244 in the $GF(2^p)$ domain. Transformed V2C messages 244 are provided to a min finder circuit 246 which calculates the $min_1(d)$, idx(d) and $min_2(d)$ sub-messages 250 for each of the q symbols in the Galois field. A select circuit 252 selects extrinsic messages from sub-messages 250 to yield intermediate output message A(d) 254, containing extrinsic $min_1(d)$, idx(d) and $min_2(d)$ messages. A combine circuit 256 combines the extrinsic messages in intermediate output message A(d) 254 to produce C2V messages 260. A transformation/renormalization circuit 262 transforms C2V messages 260 from the $GF(2^p)$ domain to the $GF(2^q)$ domain where an inverse function is available, and renormalizes C2V messages 260 in the $GF(2^q)$ domain where an inverse function is not available, yielding C2V messages 224 in the $GF(2^q)$ domain. This enables the hybrid operation in which the Galois field sizes are different in the variable node processor 202 and check node processor 204.

The C2V messages 224 are provided to an edge de-interleaver 226, which reverses the process of the edge interleaver 220, and then to a format recovery circuit 230, which converts message vectors from the second, normalized format to the first message vector format of the variable node processor 202, reversing the process of the message format converter 214. The resulting first format C2V messages 232 are provided to the variable node processor 202 for use in updating perceived log likelihood ratio values in variable nodes. In other embodiments, the variable node processor 202 is adapted to operate directly with message vectors of the second, normalized format. In these embodiments, the message format converter 214 and format recovery circuit 230 are omitted.

When the values in the hybrid min-sum based non-binary low density parity check decoder 200 converge and stabilize, or when a limit is reached on the number of local iterations, the variable node processor 202 provides the total log likelihood ratio $S_n(a)$ 234 to a decision circuit 236 to generate a hard decision 240 based on the $argmin_a$ of the total log likelihood ratio $S_n(a)$.

The perceived log likelihood ratio values $L_j(a)$ are known at the variable nodes implemented in variable node processor 202, either stored in an external log likelihood ratio memory 210 or by computing them on the fly from measurements at the input channel 206. The perceived log likelihood ratio values $L_j(a)$ are calculated using Equation 1:

$$L_j(a) = \ln \Pr(x_j = s_j | channel) - \ln \Pr(x_j = a | channel) \quad \text{Equation 1}$$

where $x_j$ is the code symbol based on the measured value a from the channel and $s_j$ is the most likely Galois field symbol of the code symbol $x_j$, calculated for the j-th check node.

In order to avoid probability multiplications and divisions, the log-probability or log-likelihood ratio (LLR) is used such that each element in the Galois field has its own value. The variable node processor 202 calculates the sum of log likelihood ratio values over all incoming C2V message vectors $R'_{i,j}=[R'_{i,j}(0) \ldots R'_{i,j}(q-1)]$ for each element in the C2V message vectors. The variable node processor 202 then produces the V2C message vectors 212 $Q'_{i,j}=[Q'_{i,j}(0) \ldots Q'_{i,j}(q-1)]$ to each neighboring check node by subtracting the log likelihood ratio value from that check node from the log likelihood ratio sum, and permuting the vector entries according to finite field multiplication by $h_{i,j}$. This vector format formed by q log likelihood ratio values is referred to herein as the first format or Format I. The V2C message vectors 212 are calculated in the variable node processor 202 according to Equations 2 and 3:

$$S_j(a) = L_j(a) + \sum_{k=1}^{\gamma_j} R'_{i_k,j}(h_{i_k,j} a) \quad \text{Equation 2}$$

where $S_j(a)$ is the log likelihood ratio sum, $L_j(a)$ is the perceived log likelihood ratio value in a variable node j, and $$\sum_{k=1}^{\gamma_j} R'_{i_k,j}(h_{i_k,j} a)$$

are the log likelihood ratio values from all check nodes.

$$Q'_{i_k,j}(h_{i_k,j} a) = S_j(a) - R'_{i_k,j}(h_{i_k,j} a) \quad \text{Equation 3}$$

$R'_{i_k,j}(h_{i_k,j} a)$ is the prior round log likelihood ratio value from the check node for which the variable node is generating the message.

The message format converter 214 normalizes the log likelihood ratio values to prevent them from going over the range, normalizing them with respect to the most likely symbol. The normalized V2C message vectors 216 (and similarly, the normalized C2V message vectors 228) are in a second format also referred to herein as Format II, which includes two parts, the most likely symbol and the log likelihood ratio of other symbols, since the most likely symbol has log likelihood ratio equal to 0 after normalization. These Format II log likelihood ratio values are expressed as $Q_{i,j}=[Q^*_{i,j}(0), Q_{i,j}(1) \ldots Q_{i,j}(q-1)]$ in normalized V2C message vectors 216 and as $R_{i,j}=[R^*_{i,j}(0), R_{i,j}(1) \ldots R_{i,j}(q-1)]$ in normalized C2V message vectors 228, where $Q^*_{i,j}(0)$ and $R^*_{i,j}(0)$ are the most likely symbols, and where $Q_{i,j}(1) \ldots Q_{i,j}(q-1)$ and $R_{i,j}(1) \ldots R_{i,j}(q-1)$ are the log likelihood ratio values of the remaining q-1 elements of the Galois field, normalized to the most likely symbols $Q^*_{i,j}(0)$ and $R^*_{i,j}(0)$, respectively. Notably, the normalization of messages not only changes log likelihood ratio values but also changes log likelihood ratio orders, from the absolute order to a relative order with respect to the most likely symbol. Thus $Q'_{i,j}(a)$ and $S_{i,j}(a)$ are in the absolute order of $a \in GF(q)$. Format II log likelihood ratio values $Q_{i,j}(d)$ and $R_{i,j}(d)$ are in the relative order of $d \in GF(q) \backslash 0$, with the most likely symbols $Q^*_{i,j}$ and $R^*_{i,j}$, respectively.

Figure 3:
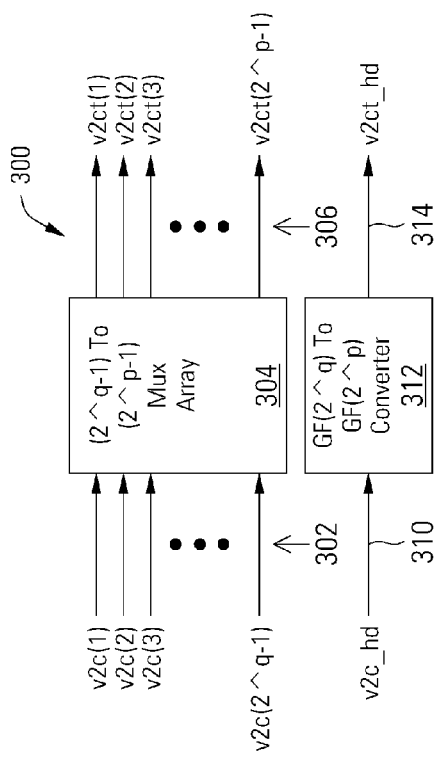
FIG. 3 is a block diagram of a transformation circuit suitable for use in place of the transformation circuit of FIG. 2 in accordance with one or more embodiments of the present invention.

Turning to FIG. 3, a transformation circuit 300 is disclosed suitable for use in place of transformation circuit 242 in accordance with one or more embodiments of the present invention. Again, the V2C messages (include soft values 302 and hard decision 310) include $2^q$ values in the $GF(2^q)$ domain, whereas the check node processor performs min-sum operations in the $GF(2^q)$ domain. The transformation circuit 300 uses h_{i,j}, an entry in parity check matrix H, to transform it to $GF(2^p)$. The resulting soft values 306 are calculated as v2ct(h_{i,j}*a)=v2c(a) for a=1 . . . ($2^q$−1) or v2ct(b)=max, with the hard decision 314 calculated as v2ct_hd=h_{i,j}*v2c_hd, using the binary form to compute the mapping then converting back to the $GF(2^p)$ domain. This hard decision calculation corresponds to the b=h*a binary matrix multiplication operation disclosed above. The $2^q$−1 messages 302 and hard decision 310 are transformed using a multiplexer array 304 and hard decision converter 312 directly to $2^p$−1 messages 306 and hard decision 314. Because there are more available output values 306, the extra or unmapped messages in the $2^p$−1 messages 306 are set to the maximum log likelihood ratio value (v2ct(b)=max). By setting the unmapped messages at the maximum value, they will not affect the $min_1(d)$, $idx(d)$ and $min_2(d)$ calculations in the check node processor.

The check node processor maintains a set of $min_1(d)$, $idx(d)$ and $min_2(d)$ values for each nonzero symbol a in $GF(2^p)$ and updates them using the v2ct(d) values in soft values 306 and hard decision 314. Thus, for each a in $GF(2^q)$, only for the (h_{1,j}*a) in $GF(2^p)$ are the set of $min_1(d)$, $idx(d)$ and $min_2(d)$ values updated by v2ct(h_{i,j}*a). Other sets are updated by the maximum value, as if not updated. V2ct_hd 314 is used in some embodiments as it is used in a non-hybrid decoder, so a syndrome S_i is computed from the sum of V2ct_hd of all connected variable nodes for each check node. The non-hybrid decoder uses syndrome S_i and V2ct_hd to compute C2vt_hd=S_i+v2ct_hd, a temporary value used internally in the check node processor for min-sum computations. C2vt_hd is in the $GF(2^p)$ domain. As with inverse rearranging in a non-hybrid decoder, the result from the check node processor is transformed back to the $GF(2^q)$ domain, however, there may not be an inverse function for all hard decision values because the Galois field in the check node processor is larger than that in the variable node processor. In such cases, the reverse transformation applied in transformation/renormalization circuit 262 is performed by renormalization.

Figure 4:
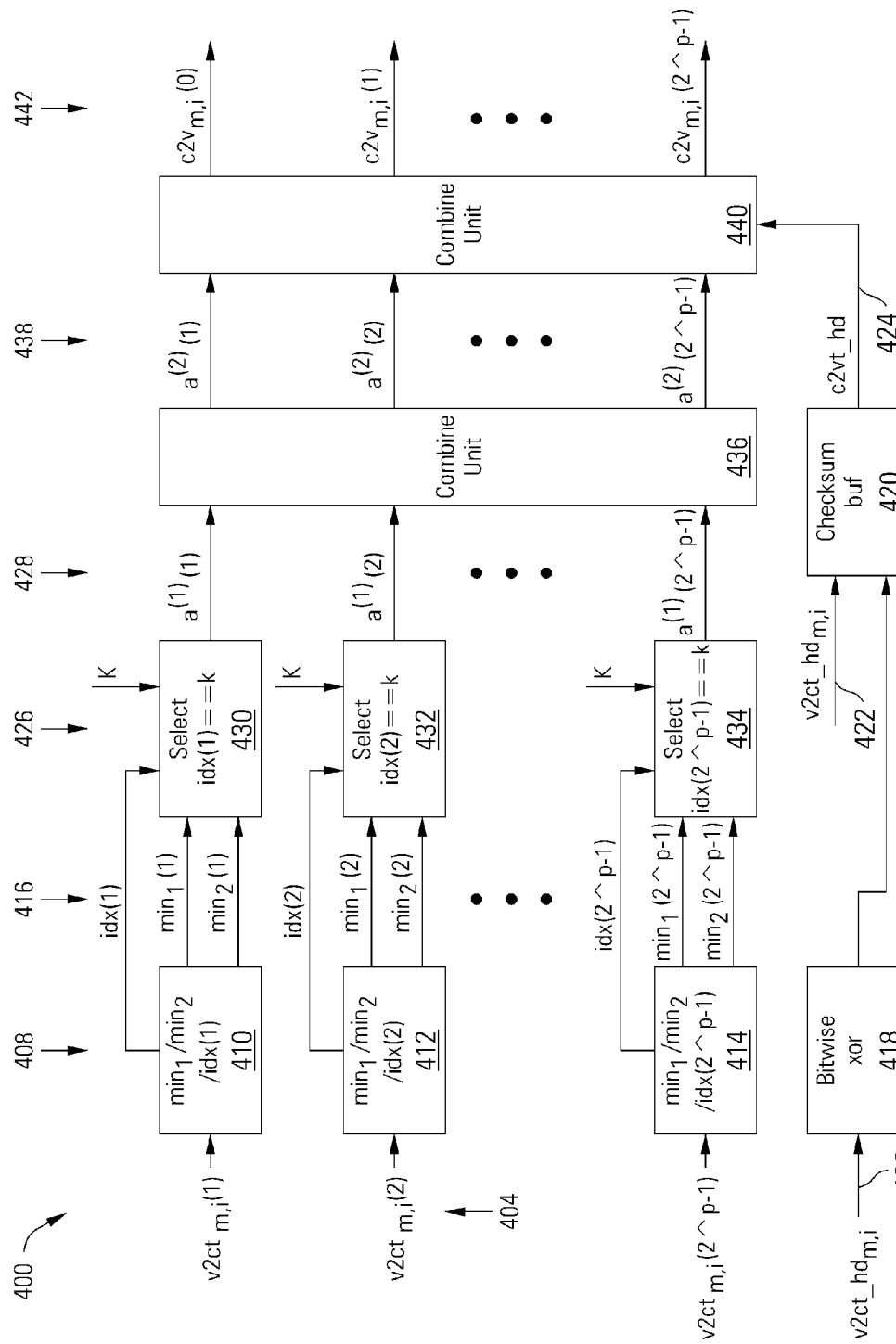
FIG. 4 is a block diagram of min finder, select and combine circuit in accordance with one or more embodiments of the present invention.

Turning to FIG. 4, a min finder, select and combine circuit 400 is disclosed suitable for use in place of min finder circuit 246, select circuit 252, combine circuit 256 and transformation circuit 262 in accordance with one or more embodiments of the present invention. The functions performed by the min finder, select and combine circuit 400 may be performed in a single circuit or may divide functionality across a number of separate circuits. The transformed V2C messages 402, including $2^p$−1 soft values 404 and a hard decision 406, are processed in a min finder portion 408 of the min finder, select and combine circuit 400, performing the function of the min finder circuit 246 in some embodiments. The min finder portion 408 includes a number of $min_1(d)$, $idx(d)$ and $min_2(d)$ finding circuits 410, 412, 414, operable to process the $2^p$−1 soft values 404 to produce $min_1(d)$, $idx(d)$ and $min_2(d)$ values 416 for each of the $2^p$−1 soft values 404.

The min finder portion 408 calculates the $min_1(d)$, $idx(d)$ and $min_2(d)$ sub-messages 416 for each of the $2^p$−1 soft values 404, based on the sub-messages $Q_{i,jk}(d)$ in the message vectors from each neighboring variable node, using comparators and buffers to recursively scan through each message vector from each neighboring variable node. The operation of the $min_1(d)$, $idx(d)$ and $min_2(d)$ finding circuits 410, 412, 414 in the min finder portion 408 may be described in the following logic statements and in Equations 4, 5 and 6:

if $min_1(d) > Q_{i,jk}(d)$,
$idx(d) = i$;
$min_2(d) = min_1(d)$;
$min_1(d) = Q_{i,jk}(d)$;
else
$idx(d) = idx(d)$;
$min_2(d) = min(min_2(d), Q_{i,jk}(d))$;

$$min_1(d) = \min_{k=1 \ldots \rho_i} Q_{i,j_k}(d) \qquad \text{Equation 4}$$

$$idx(d) = \arg\min_{k=1 \ldots \rho_i} Q_{i,j_k}(d) \qquad \text{Equation 5}$$

$$min_2(d) = \min_{k=1 \ldots \rho_i, k \neq idx(d)} Q_{i,j_k}(d) \qquad \text{Equation 6}$$

The hard decision 406, the symbol portion of each message vector from each neighboring variable node, is processed in an XOR circuit 418 and memory 420 Each of the most likely symbols $Q^*_{i,j}$ in the transformed V2C messages 244 is provided to the XOR circuit 418, where they are recursively XORed together. The intermediate checksum results are stored in memory 420 along with the first hard decision 422, yielding the hard decision $P_i$ 424, thus calculating the checksum for k=1 . . . $\rho_i$ according to Equation 7 and hard decision $R^*_{i,j_k}$ according to Equation 8:

$$P_i = \sum_{k=1}^{\rho_i} Q^*_{i,j_k} \qquad \text{Equation 7}$$

$$R^*_{i,j_k} = P_i + Q^*_{i,j_k} \qquad \text{Equation 8}$$

The select and combine circuits 252, 256 operate in the $GF(2^p)$ domain, but not all symbols in $GF(2^p)$ can be inverse-mapped to the $GF(2^q)$ domain in the C2V messages 224. Therefore, the select and combine circuits 252, 256 do not need to perform message computations for all b in $GF(2^p)$, depending on the entry value for each connected variable node. All $2^p$−1 non-zero symbols with an inverse are listed, according to h_{i,j}. For each symbol in the list, a+c2vt_hd is computed. If any a+c2vt_hd is equal to 0, then a=c2vt_hd is the true hard decision, that is, c2v_hd=c2vt_hd. Except for this set a, all other symbols are processed in the select and combine circuits 252, 256. If there are no such symbols, all symbols need to be processed in the select and combine circuits 252, 256. In that case, renormalization is needed to find the real hard decision, since c2vt_hd has no inverse and is thus not the real hard decision.

The $min_1(d)$, $idx(d)$ and $min_2(d)$ values 416 are processed in a select circuit 426 that is suitable for use as a replacement for select circuit 252 in some embodiments. For values of k from 1 to $\rho_i$ with $j_k=N_i(k)$, the approximation messages 428 are calculated in the select circuit 426, selecting $min_1(d)$ if $k \neq idx(d)$ and $min_2(d)$ if $k=idx(d)$ with the goal of avoiding messages from current variable nodes. The selection is performed in a group of $2^p-1$ selector circuits 430, 432, 434, controlled by index inputs cycling through the values of k. The $2^p-1$ selector circuits 430, 432, 434 produce $2^p-1$ approximation message outputs $A^{(1)}(d)$ 428. Output A(d) is set to $min_1(d)$ if $k \neq idx(d)$ and to $min_2(d)$ if $k=idx(d)$. This selection operation may also be represented by the pseudocode statement select idx==k?B:A, where A and B are minimum and sub-minimum log likelihood ratio values for a particular Galois field element, idx is the input identifying the variable node that provided the minimum and sub-minimum log likelihood ratio values, and k is a variable that cycles through each variable node.

The approximation messages $A^{(1)}(d)$ 428 are processed in a first combine circuit 436 which yields $2^p-1$ outputs $A^{(2)}(d)$ 438. Intermediate output messages $A^{(2)}(d)$ 438 are provided to a second combine circuit 440 which yields $2^q-1$ outputs $c2v_{m,1}(d)$ 442. First and second combine circuits 436, 440 are suitable for use as a replacement of combine circuit 256 in some embodiments of the present invention, with second combine circuit 440 also performing the transformation function of the transformation/renormalization circuit 262.

Figure 5:
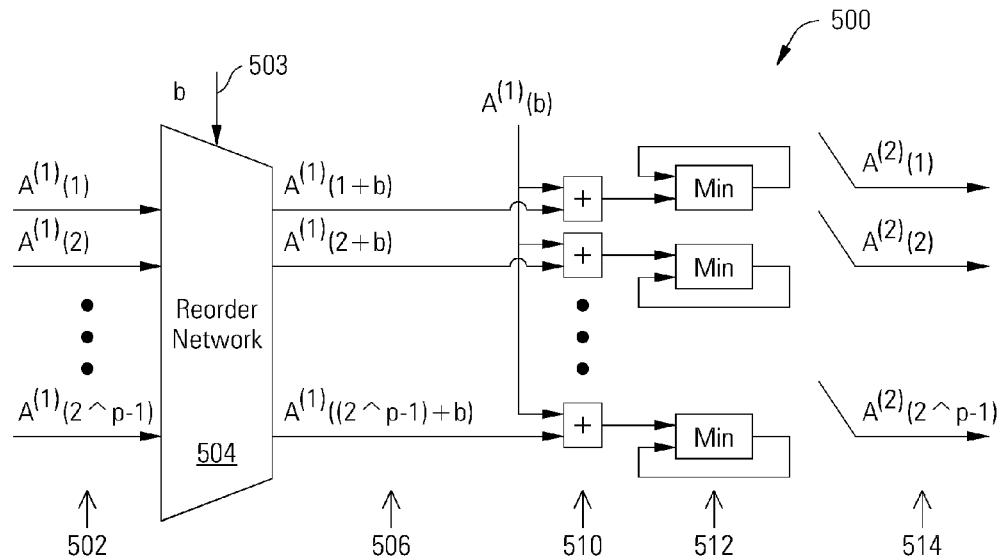
FIG. 5 is a block diagram of a first combine circuit in accordance with one or more embodiments of the present invention.

Turning to FIG. 5, an embodiment of a first combine circuit 500 is disclosed that is suitable for use as a replacement for first combine circuit 436 in accordance with one or more embodiments of the present invention. Because not all the messages in the check node processor can be mapped back for the variable node processor, the computation in the check node processor only needs to include messages that can be mapped to the smaller variable node processor Galois field, thereby reducing circuit area. The min1 and min2 values are loaded to the $2^p-1$ approximation messages $A^{(1)}(d)$ 502 and stored in a register. A reorder network 504 is used to reorder or permute approximation messages $A^{(1)}(d)$ 502 to yield reordered approximation messages $A^{(1)}(d+b)$ 506, where b 503 is a symbol used as an index value that is swept from 0 to $2^p-1$. For each element b, the order of the a messages are reordered and combined with the b messages. A number of adders 510 combine each pair of log likelihood ratio values which are then compared in comparators 512 to select the minimum values as to yield $2^p-1$ outputs $A^{(2)}(d)$ 514. By sweeping b through all possible values, the first combine circuit 500 adds every possible combination of min1 and min2 values in the $2^p-1$ approximation messages $A^{(1)}(d)$ 502. In other embodiments, rather than sweeping values of b, a tree structure of adders is used to complete the function performed by first combine circuit 500 in less time but with a larger circuit.

Figure 6:
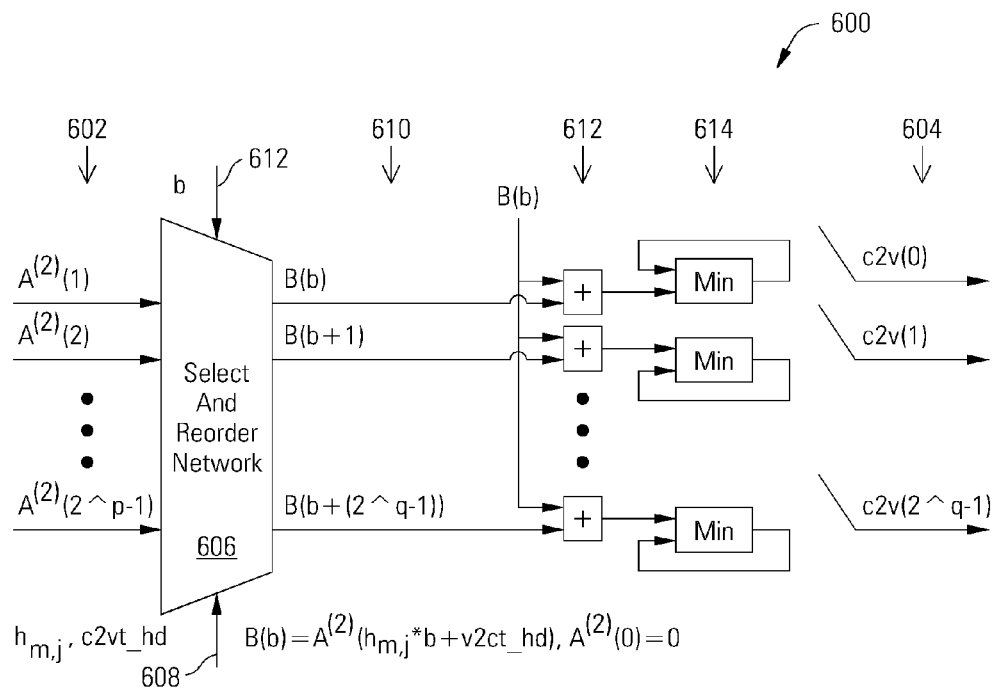
FIG. 6 is a block diagram of a second combine circuit in accordance with one or more embodiments of the present invention.

Turning to FIG. 6, an embodiment of a second combine circuit 600 is disclosed that is suitable for use as a replacement for second combine circuit 440 in accordance with one or more embodiments of the present invention. Because not all the messages in the check node processor can be mapped back for the variable node processor, the computation in the check node processor only needs to include messages that can be mapped to the smaller variable node processor Galois field, thereby reducing circuit area. The $A^{(2)}(d)$ values 602 (e.g., from 514, FIG. 5) are stored in a register in some embodiments. A select and reorder network 606 is used to reorder or permute $A^{(2)}(d)$ values 602 to yield reordered approximation messages B(d+b) 610, where b 612 is a symbol used as an index value that is swept from 0 to $2^q-1$. The select and reorder network 606 selects and reorders $2^q$ output messages 604 from the $2^p-1$ input messages based on the $h_{m,j}$, c2vt_hd value 608, where $h_{m,j}$ is a pxq binary matrix. In other words, for b=0, 1, ... $2^q-1$ in $GF(2^q)$, the select and reorder network 606 selects $B(b)=A^{(2)}(h_{m,j}*b+v2ct\_hd)$, $B(b+1)=A^{(2)}(h_{m,j}*(b+1)+v2ct\_hd)$, and so on. The $h_{m,j}$ 608 is an element in the linear group, so it performs a mapping from the variable node field to the check node field. The reordered approximation messages B(d+b) 610 are added to each other in each possible combination in adders 612 by sweeping b from 0 to $2^p-1$, and the minimums are found with comparators 614 to yield $2^q$ C2V outputs 604. C2V(a) is therefore calculated as $C2V(a)=min_{b=0...2^q-1}(B(a)+B(b+a))$.

The renormalization performed by transformation/renormalization circuit 262, if needed, sets C2vt(a) to $C2vt(h_{i,j}*a)$ for each a in $GF(2^q)$. In this format, there is no hard decision, and 0-padding can be included in the variable node processor to change the format of the C2V messages.

Figure 7:
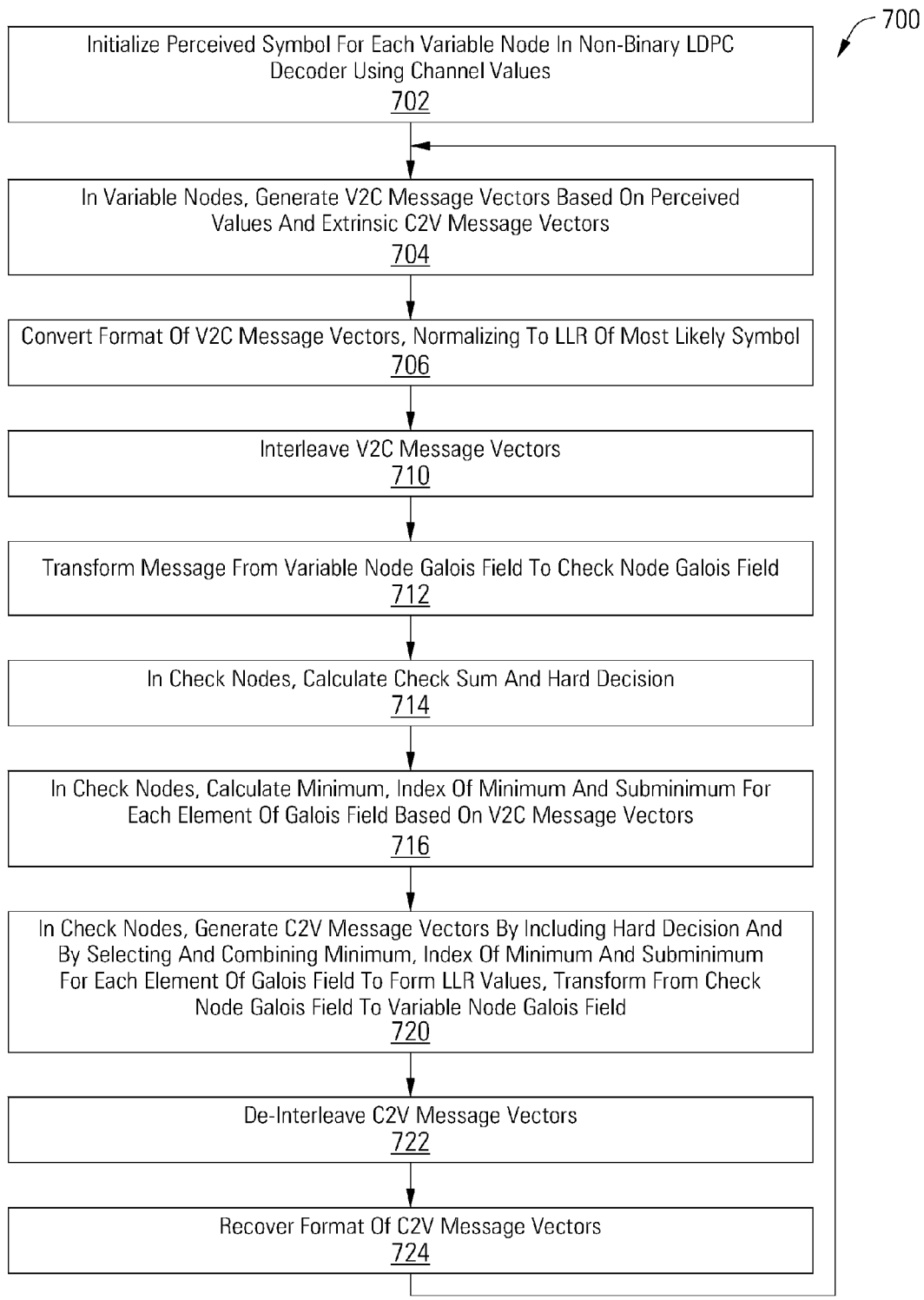
FIG. 7 depicts a flow diagram showing a method for hybrid min-sum based non-binary low density parity check decoding in accordance with one or more embodiments of the present invention.

Turning now to FIG. 7, a flow diagram 700 depicts a method for hybrid min-sum based non-binary low density parity check decoding in accordance with some embodiments of the present invention. The method of FIG. 7, or variations thereof, may be performed in data decoding circuits such as those illustrated in FIGS. 1-6. Following flow diagram 700, the perceived symbol is initialized for each variable node in a hybrid min-sum based non-binary low density parity check decoder using channel values. (Block 702) V2C message vectors are generated for variable nodes based on perceived values and extrinsic C2V message vectors. (Block 704) In some embodiments, the format of the V2C message vectors is converted, normalizing log likelihood ratio values to the log likelihood ratio of the most likely symbol. (Block 706) The V2C message vectors are interleaved in some embodiments in an edge interleaver. (Block 710) The messages are transformed from the variable node Galois field to the check node Galois field. (Block 712) A check sum and hard decision is calculated for each check node. (Block 714) The minimum, index of minimum and next minimum are also calculated in each check node for each element of the Galois field based on extrinsic V2C message vectors. (Block 716) C2V message vectors are generated for each check node by include the hard decision and by selecting and combining minimum, index of minimum and subminimum values for each element of the Galois field to form log likelihood ratio values, and the messages are transformed from the check node Galois field to the variable node Galois field. (Block 720) In some embodiments, the C2V message vectors are de-interleaved to reverse the interleaving of block 710. (Block 722) The format of the C2V message vectors is recovered in some embodiments, reversing the format conversion of block 706. (Block 724) Iterations continue with message vectors generated and passed between variable nodes and check nodes until values converge or until a limit on local iterations is reached.

Although the hybrid min-sum based non-binary low density parity check decoder is not limited to any particular application, several examples of applications are presented herein that benefit from embodiments of the present inventions. Turning to FIG. 8, a read channel 800 is used to process an analog signal 802 and to retrieve user data bits from the analog signal 802 without errors. In some cases, analog signal 802 is derived from a read/write head assembly in a magnetic storage medium. In other cases, analog signal 802 is derived from a receiver circuit that is operable to receive a signal from a transmission medium. The transmission medium may be wireless or wired such as, but not limited to, cable or optical connectivity. Based upon the disclosure provided herein, one of ordinary skill in the art will recognize a variety of sources from which analog signal 802 may be derived.

The read channel 800 includes an analog front end 804 that receives and processes the analog signal 802. Analog front end 804 may include, but is not limited to, an analog filter and an amplifier circuit as are known in the art. Based upon the disclosure provided herein, one of ordinary skill in the art will recognize a variety of circuitry that may be included as part of analog front end 804. In some cases, the gain of a variable gain amplifier included as part of analog front end 804 may be modifiable, and the cutoff frequency and boost of an analog filter included in analog front end 804 may be modifiable. Analog front end 804 receives and processes the analog signal 802, and provides a processed analog signal 806 to an analog to digital converter 810.

Analog to digital converter 810 converts processed analog signal 806 into a corresponding series of digital samples 812. Analog to digital converter 810 may be any circuit known in the art that is capable of producing digital samples corresponding to an analog input signal. Based upon the disclosure provided herein, one of ordinary skill in the art will recognize a variety of analog to digital converter circuits that may be used in relation to different embodiments of the present invention. Digital samples 812 are provided to an equalizer 814. Equalizer 814 applies an equalization algorithm to digital samples 812 to yield an equalized output 816. In some embodiments of the present invention, equalizer 814 is a digital finite impulse response filter circuit as is known in the art. Data or codewords contained in equalized output 816 may be stored in a buffer 818 until a data detector 820 is available for processing.

The data detector 820 performs a data detection process on the received input, resulting in a detected output 822. In some embodiments of the present invention, data detector 820 is a Viterbi algorithm data detector circuit, or more particularly in some cases, a maximum a posteriori (MAP) data detector circuit as is known in the art. In some of these embodiments, the detected output 822 contains log likelihood ratio soft information about the likelihood that each bit or symbol has a particular value. Based upon the disclosure provided herein, one of ordinary skill in the art will recognize a variety of data detectors that may be used in relation to different embodiments of the present invention. Data detector 820 is started based upon availability of a data set in buffer 818 from equalizer 814 or another source.

The detected output 822 from data detector 820 is provided to an interleaver 824 that protects data against burst errors. Burst errors overwrite localized groups or bunches of bits. Because low density parity check decoders are best suited to correcting errors that are more uniformly distributed, burst errors can overwhelm low density parity check decoders. The interleaver 824 prevents this by interleaving or shuffling the detected output 822 from data detector 820 to yield an interleaved output 826 which is stored in a memory 830. The interleaved output 826 from the memory 830 is provided to an low density parity check decoder with flexible saturation 832 which performs parity checks on the interleaved output 826, ensuring that parity constraints established by an low density parity check encoder (not shown) before storage or transmission are satisfied in order to detect and correct any errors that may have occurred in the data during storage or transmission or during processing by other components of the read channel 800.

Multiple detection and decoding iterations may be performed in the read channel 800, referred to herein as global iterations. (In contrast, local iterations are decoding iterations performed within the low density parity check decoder 832.) To perform a global iteration, log likelihood ratio values 834 from the low density parity check decoder 832 are stored in memory 830, deinterleaved in a deinterleaver 836 to reverse the process applied by interleaver 824, and provided again to the data detector 820 to allow the data detector 820 to repeat the data detection process, aided by the log likelihood ratio values 834 from the low density parity check decoder 832. In this manner, the read channel 800 can perform multiple global iterations, allowing the data detector 820 and low density parity check decoder 832 to converge on the correct data values.

The low density parity check decoder 832 also produces hard decisions 840 about the values of the data bits or symbols contained in the interleaved output 826 of the interleaver 824. The hard decisions 840 from low density parity check decoder 832 are deinterleaved in a hard decision deinterleaver 842, reversing the process applied in interleaver 824, and stored in a hard decision memory 844 before being provided to a user or further processed. For example, the output 846 of the read channel 800 may be further processed to reverse formatting changes applied before storing data in a magnetic storage medium or transmitting the data across a transmission channel.

Turning to FIG. 9, a storage system 900 is illustrated as an example application of a data processing system with a hybrid non-binary low density parity check decoder in accordance with some embodiments of the present invention. The storage system 900 includes a read channel circuit 902 with a data processing system with a hybrid non-binary low density parity check decoder in accordance with some embodiments of the present invention. Storage system 900 may be, for example, a hard disk drive. Storage system 900 also includes a preamplifier 904, an interface controller 906, a hard disk controller 910, a motor controller 912, a spindle motor 914, a disk platter 916, and a read/write head assembly 920. Interface controller 906 controls addressing and timing of data to/from disk platter 916. The data on disk platter 916 consists of groups of magnetic signals that may be detected by read/write head assembly 920 when the assembly is properly positioned over disk platter 916. In one embodiment, disk platter 916 includes magnetic signals recorded in accordance with either a longitudinal or a perpendicular recording scheme.

In a typical read operation, read/write head assembly 920 is accurately positioned by motor controller 912 over a desired data track on disk platter 916. Motor controller 912 both positions read/write head assembly 920 in relation to disk platter 916 and drives spindle motor 914 by moving read/write head assembly 920 to the proper data track on disk platter 916 under the direction of hard disk controller 910. Spindle motor 914 spins disk platter 916 at a determined spin rate (RPMs). Once read/write head assembly 920 is positioned adjacent the proper data track, magnetic signals representing data on disk platter 916 are sensed by read/write head assembly 920 as disk platter 916 is rotated by spindle motor 914. The sensed magnetic signals are provided as a continuous, minute analog signal representative of the magnetic data on disk platter 916. This minute analog signal is transferred from read/write head assembly 920 to read channel circuit 902 via preamplifier 904. Preamplifier 904 is operable to amplify the minute analog signals accessed from disk platter 916. In turn, read channel circuit 902 decodes and digitizes the received analog signal to recreate the information originally written to disk platter 916. This data is provided as read data 922 to a receiving circuit. While processing the read data, read channel circuit 902 processes the received signal using a data processing system with penalty based multi-variant encoding. Such a data processing system with a hybrid non-binary low density parity check decoder may be implemented consistent with the circuits and methods disclosed in FIGS. 1-7. A write operation is substantially the opposite of the preceding read operation with write data 924 being provided to read channel circuit 902. This data is then encoded and written to disk platter 916.

It should be noted that storage system 900 may be integrated into a larger storage system such as, for example, a RAID (redundant array of inexpensive disks or redundant array of independent disks) based storage system. Such a RAID storage system increases stability and reliability through redundancy, combining multiple disks as a logical unit. Data may be spread across a number of disks included in the RAID storage system according to a variety of algorithms and accessed by an operating system as if it were a single disk. For example, data may be mirrored to multiple disks in the RAID storage system, or may be sliced and distributed across multiple disks in a number of techniques. If a small number of disks in the RAID storage system fail or become unavailable, error correction techniques may be used to recreate the missing data based on the remaining portions of the data from the other disks in the RAID storage system. The disks in the RAID storage system may be, but are not limited to, individual storage systems such storage system 900, and may be located in close proximity to each other or distributed more widely for increased security. In a write operation, write data is provided to a controller, which stores the write data across the disks, for example by mirroring or by striping the write data. In a read operation, the controller retrieves the data from the disks. The controller then yields the resulting read data as if the RAID storage system were a single disk.

A hybrid non-binary low density parity check decoder is applicable to transmission of information over virtually any channel or storage of information on virtually any media. Transmission applications include, but are not limited to, optical fiber, radio frequency channels, wired or wireless local area networks, digital subscriber line technologies, wireless cellular, Ethernet over any medium such as copper or optical fiber, cable channels such as cable television, and Earth-satellite communications. Storage applications include, but are not limited to, hard disk drives, compact disks, digital video disks, magnetic tapes and memory devices such as DRAM, NAND flash, NOR flash, other non-volatile memories and solid state drives.

In addition, it should be noted that storage system 900 may be modified to include solid state memory that is used to store data in addition to the storage offered by disk platter 916. This solid state memory may be used in parallel to disk platter 916 to provide additional storage. In such a case, the solid state memory receives and provides information directly to read channel circuit 902. Alternatively, the solid state memory may be used as a cache where it offers faster access time than that offered by disk platted 916. In such a case, the solid state memory may be disposed between interface controller 906 and read channel circuit 902 where it operates as a pass through to disk platter 916 when requested data is not available in the solid state memory or when the solid state memory does not have sufficient storage to hold a newly written data set. Based upon the disclosure provided herein, one of ordinary skill in the art will recognize a variety of storage systems including both disk platter 916 and a solid state memory.

Turning to FIG. 10, a wireless communication system 1000 or data transmission device including a transmitter 1002 with a data processing system with a hybrid non-binary low density parity check decoder is shown in accordance with some embodiments of the present invention. The transmitter 1002 is operable to transmit encoded information via a transfer medium 1006 as is known in the art. The encoded data is received from transfer medium 1006 by receiver 1004. Transmitter 1002 incorporates a data processing system with a hybrid non-binary low density parity check decoder. Such a data processing system with a hybrid non-binary low density parity check decoder may be implemented consistent with the circuits and methods disclosed in FIGS. 1-7.

It should be noted that the various blocks discussed in the above application may be implemented in integrated circuits along with other functionality. Such integrated circuits may include all of the functions of a given block, system or circuit, or a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, the present invention provides novel systems, devices, methods and arrangements for data processing with a hybrid non-binary low density parity check decoder. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. An apparatus for decoding data comprising:
   a variable node processor, wherein the variable node processor is operable to generate variable node to check node messages and to calculate perceived values based on check node to variable node messages;
   a check node processor, wherein the check node processor is operable to generate the check node to variable node messages and to calculate checksums based on variable node to check node messages, wherein the variable node processor and the check node processor comprise different Galois fields; and
   a field transformation circuit operable to transform the variable node to check node messages from a first of the different Galois fields to a second of the Galois fields.

2. The apparatus of claim 1, wherein the apparatus comprises a non-binary low density parity check data decoder.

3. The apparatus of claim 1, wherein the check node processor comprises:
   a minimum and next minimum finder circuit operable to process a plurality of sub-messages in each of the variable node to check node messages; and
   a select and combine circuit operable to combine an output of the minimum and next minimum finder circuit to generate the check node to variable node messages.

4. The apparatus of claim 3, wherein the variable node to check node messages and the check node to variable node messages are in the first of the different Galois fields, and wherein the minimum and next minimum finder circuit and the select and combine circuit are in the second of the different Galois fields.

5. The apparatus of claim 4, wherein the second of the different Galois fields is larger than the first of the different Galois fields.

6. The apparatus of claim 1, wherein the field transformation circuit is operable to transform the variable node to check node messages using at least one linear group.

7. The apparatus of claim 1, wherein the field transformation circuit is operable to transform the variable node to check node messages using two linear groups.

8. The apparatus of claim 1, wherein the field transformation circuit is operable to transform the variable node to check node messages by defining a parity check matrix in a linear group and mapping between parity check matrix elements and linear group members.

9. The apparatus of claim 1, wherein the field transformation circuit is operable to transform the variable node to check node messages at least in part by converting a codeword containing elements of a first of the Galois fields to a binary image codeword and performing a syndrome calculation using the binary image codeword and a binary image of a parity check matrix.

10. The apparatus of claim 1, wherein the apparatus is incorporated in a storage device.

11. The apparatus of claim 10, wherein the storage device comprises:
a storage medium maintaining a data set; and
a read/write head assembly operable to sense the data set on the storage medium and to provide an analog output corresponding to the data set, wherein the variable node processor is operable to receive a signal derived from the analog output.

12. The apparatus of claim 1, wherein the apparatus is incorporated in a data transmission device.

13. A method for decoding non-binary low density parity check encoded data, the method comprising:
generating a variable node to check node message vector in a variable node processor based at least in part on a plurality of check node to variable node message vectors, the variable node to check node message vector and the check node to variable node message vectors comprising elements of a first Galois field;
transforming the variable node to check node message vector from the first Galois field to a second Galois field, wherein the second Galois field is larger than the first Galois field;
calculating a check sum and hard decision in a check node processor in a check node processor based at least in part on a plurality of variable node to check node message vectors in the second Galois field;
calculating minimum, index of minimum and sub-minimum values in the check node processor based on the plurality of variable node to check node message vectors; and
generating a check node to variable node message vector in the check node processor by combining the minimum, index of minimum and sub-minimum values, wherein the check node to variable node message vector is generated with elements of the first Galois field.

14. The method of claim 13, wherein transforming the variable node to check node message vector from the first Galois field to the second Galois field comprises mapping elements of the first Galois field using at least one linear group.

15. The method of claim 14, wherein transforming the variable node to check node message vector from the first Galois field to the second Galois field comprises performing a plurality of mappings from elements of the first Galois field using a series of linear groups.

16. The method of claim 13, wherein transforming the variable node to check node message vector from the first Galois field to the second Galois field comprises defining a parity check matrix in a linear group and mapping between parity check matrix elements and linear group members.

17. The method of claim 13, wherein transforming the variable node to check node message vector from the first Galois field to the second Galois field comprises converting a codeword containing elements of the first Galois field to a binary image codeword and performing a syndrome calculation using the binary image codeword and a binary image of a parity check matrix.

18. A data decoding circuit, the circuit comprising:
a variable node processor, wherein the variable node processor is operable to generate variable node to check node message vectors and to calculate perceived values based on check node to variable node message vectors, and wherein the perceived values may take any of a plurality of values from elements of a first Galois field; and
a check node processor, wherein the check node processor is operable to generate the check node to variable node message vectors and to calculate checksums based on the variable node to check node message vectors, wherein the check node processor operates with a second Galois field that is larger than the first Galois field, and wherein the check node processor is operable to transform messages between the first Galois field and the second Galois field.

19. The data decoding circuit of claim 18, wherein the check node processor comprises:
a minimum and subminimum finder circuit operable to process a plurality of sub-messages in each of the variable node to check node message vectors, wherein the minimum and subminimum finder circuit is operable to identify a minimum log likelihood ratio, an index of the minimum log likelihood ratio, and a sub-minimum log likelihood ratio for each of the elements of the first Galois Field from each of the variable node to check node message vectors, wherein the minimum and sub-minimum finder circuit operates in a domain of the second Galois field; and
a select and combine circuit operable to combine an output of the minimum and subminimum finder circuit to generate the check node to variable node message vectors in a domain of the first Galois field.

20. The data decoding circuit of claim 18, wherein the check node processor is operable to transform messages between the first Galois field and the second Galois field by defining a parity check matrix in a linear group and mapping between parity check matrix elements and linear group members.

* * * * *